United States Patent
Nishi et al.

(10) Patent No.: US 8,455,753 B2
(45) Date of Patent: Jun. 4, 2013

(54) SOLAR CELL AND SEMICONDUCTOR DEVICE, AND MANUFACTURING METHOD THEREOF

(75) Inventors: Kazuo Nishi, Yamanashi (JP); Tomoyuki Aoki, Kanagawa (JP); Toshiyuki Isa, Kanagawa (JP); Gen Fujii, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 437 days.

(21) Appl. No.: 11/324,491

(22) Filed: Jan. 4, 2006

(65) Prior Publication Data

US 2006/0157105 A1 Jul. 20, 2006

(30) Foreign Application Priority Data

Jan. 14, 2005 (JP) ................. 2005-007365

(51) Int. Cl.
*H01L 31/00* (2006.01)
(52) U.S. Cl.
USPC ............... 136/256; 136/252; 438/98; 257/53; 257/431; 257/466; 257/E27.125
(58) Field of Classification Search
USPC ............... 136/256, 263, 252; 438/82, 98; 257/E31.126, 53, 431, 466, E27.125
See application file for complete search history.

(56) References Cited

U.S. PATENT DOCUMENTS

| | | | | |
|---|---|---|---|---|
| 4,617,421 A | * | 10/1986 | Nath et al. | 136/244 |
| 4,865,999 A | * | 9/1989 | Xi et al. | 438/83 |
| 4,968,354 A | | 11/1990 | Nishiura et al. | |
| 4,981,525 A | * | 1/1991 | Kiyama et al. | 136/244 |
| 4,999,308 A | | 3/1991 | Nishiura et al. | |
| 5,348,589 A | | 9/1994 | Arai et al. | |
| 5,421,908 A | * | 6/1995 | Yoshida et al. | 136/244 |
| 5,453,134 A | | 9/1995 | Arai et al. | |

(Continued)

FOREIGN PATENT DOCUMENTS

| | | |
|---|---|---|
| CN | 1116458 A | 2/1996 |
| EP | 0 681 335 A1 | 11/1995 |

(Continued)

OTHER PUBLICATIONS

Office Action of Chinese counterpart application (Application No. 200610005127.8), dated Dec. 26, 2008, with English translation.

*Primary Examiner* — Golam Mowla
(74) *Attorney, Agent, or Firm* — Nixon Peabody LLP; Jeffrey L. Costellia (57) ABSTRACT

It is an object of the present invention to minimize an electrode in a solar cell to minimize the solar cell. The present invention provides a method for manufacturing a solar cell comprising the steps of forming a first electrode layer over a substrate, forming a photoelectric conversion layer over the first electrode layer, forming an organic layer over the photoelectric conversion layer, forming an opening reaching the first electrode layer in the photoelectric conversion layer, and forming a second electrode layer by filling the opening with a conductive paste, wherein the organic layer modifies the surface of the photoelectric conversion layer and a contact angle between the conductive paste and the photoelectric conversion becomes greater. According to the present invention, wettability of a photoelectric conversion layer can be decreased by forming an organic layer on a surface of the photoelectric conversion layer. Thereby an electrode layer and an insulating isolation layer can be thinned.

28 Claims, 11 Drawing Sheets

U.S. PATENT DOCUMENTS

| | | | |
|---|---|---|---|
| 5,458,695 A * | 10/1995 | Arai et al. | 136/256 |
| 5,637,156 A | 6/1997 | Kubota et al. | |
| 5,650,019 A * | 7/1997 | Yamada et al. | 136/251 |
| 5,681,402 A * | 10/1997 | Ichinose et al. | 136/256 |
| 5,821,597 A | 10/1998 | Nakajima et al. | |
| 5,928,439 A * | 7/1999 | Ota et al. | 136/255 |
| 5,994,642 A | 11/1999 | Higuchi et al. | |
| 6,051,778 A | 4/2000 | Ichinose et al. | |
| 6,225,552 B1 * | 5/2001 | Nishi et al. | 136/256 |
| 6,268,558 B1 | 7/2001 | Kubota | |
| 6,444,899 B2 | 9/2002 | Kubota et al. | |
| 6,452,089 B1 | 9/2002 | Kubota | |
| 6,501,014 B1 * | 12/2002 | Kubota et al. | 136/256 |
| 6,521,823 B2 * | 2/2003 | Kubota et al. | 136/246 |
| 6,580,027 B2 | 6/2003 | Forrest et al. | |
| 6,657,378 B2 | 12/2003 | Forrest et al. | |
| 6,846,696 B2 * | 1/2005 | Adachi et al. | 438/80 |
| 7,141,735 B2 | 11/2006 | Ikeda et al. | |
| 7,601,910 B2 | 10/2009 | Forrest et al. | |
| 2001/0015221 A1 * | 8/2001 | Kubota et al. | 136/256 |
| 2001/0017153 A1 * | 8/2001 | Kubota et al. | 136/256 |
| 2002/0121334 A1 * | 9/2002 | Ikeda et al. | 156/246 |
| 2003/0016118 A1 * | 1/2003 | Schemenaur et al. | 338/309 |
| 2003/0017641 A1 | 1/2003 | Adachi et al. | |
| 2004/0031519 A1 * | 2/2004 | Andriessen | 136/252 |
| 2004/0187917 A1 * | 9/2004 | Pichler | 136/263 |
| 2005/0074963 A1 | 4/2005 | Fujii et al. | |
| 2005/0112906 A1 | 5/2005 | Maekawa et al. | |
| 2010/0043861 A1 | 2/2010 | Forrest et al. | |

FOREIGN PATENT DOCUMENTS

| | | |
|---|---|---|
| EP | 0 986 109 A1 | 3/2000 |
| EP | 1 311 001 A1 | 5/2003 |
| JP | 01-025235 | 4/1984 |
| JP | 64-054768 A | 3/1989 |
| JP | 01-025235 | 5/1989 |
| JP | 01-166574 A | 6/1989 |
| JP | 01-168073 | 7/1989 |
| JP | 02-170473 A | 7/1990 |
| JP | 05-183177 | 7/1993 |
| JP | 08-231675 | 9/1996 |
| JP | 2698401 | 9/1997 |
| JP | 11-121779 | 4/1999 |
| JP | 11-330506 | 11/1999 |
| JP | 11-340490 | 12/1999 |
| JP | 2001-111076 A | 4/2001 |
| JP | 2004-039891 | 2/2004 |
| JP | 2004-273272 | 9/2004 |
| JP | 200422379 | 11/2004 |
| TW | 556448 | 10/2003 |
| TW | 595034 | 11/2004 |
| WO | WO-02/101838 A1 | 12/2002 |

* cited by examiner

SOLAR CELL AND SEMICONDUCTOR DEVICE, AND MANUFACTURING METHOD THEREOF

BACKGROUND OF THE INVENTION

1. Field of the Invention

The present invention relates to a structure of a semiconductor device such as a solar cell and a manufacturing method thereof

2. Description of the Related Art

A solar cell has been spread not only to be used as a solar electric power generation system installed outdoors but also to be used as a power source of an electronic device with low power consumption such as a calculator, a radio, and a watch. In such a consumer use, when an appearance of an electronic device is as important as a function thereof as is the case for a wrist watch, for example, a mounting method of the solar cell is also devised. The solar cell is directly used as a dial of a watch, or is placed under a semitranslucent dial of the watch to make it unnoticeable.

A large part of a solar cell is composed of a substrate formed from glass, stainless, or an organic resin material or the like, and a photoelectric conversion layer formed by a thin film of an amorphous semiconductor, a microcrystalline semiconductor, or a chalcopalide-based (or II-VI group) compound semiconductor stacked over the substrate. Especially, a solar cell using an organic resin material for the substrate is thin and lightweight, and has an excellent shock resistance, so that it is not easily cracked even if it is dropped. Accordingly, it is suitable for the solar cell to be mounted to a portable product such as a card type calculator, or a wrist watch, and a remote-control device of an indoor electronic device such as a television (see Japanese Patent Application Laid-Open No. 2001-185745).

A solar cell which is used for various electric devices is needed to be reduced in size and weight as a reduction in size and weight of an electronic device.

SUMMARY OF THE INVENTION

It is an object of the present invention to provide a solar cell in which an electrode layer and an insulating isolation layer are minimized by removing an excess portion to reduce a region which shields light, thereby a light receiving region can be enlarged.

In the present invention, an organic layer is formed on a surface of a photoelectric conversion layer such as an amorphous semiconductor layer to decrease wettability of the amorphous semiconductor layer. Thus, a contact angle between the amorphous semiconductor layer and an electrode or an insulating isolation layer becomes greater, thereby miniaturization of the electrode layer and the insulating isolation layer can be realized. In addition, since the contact angle between the amorphous semiconductor layer and the electrode or the insulating isolation layer becomes greater, a region which shields light can be reduced to enlarge a light receiving region. Further, an excess thickness of the electrode layer and the insulating isolation layer can be removed.

The present invention provides a method for manufacturing a solar cell comprising the steps of forming a first electrode layer over a substrate, forming a photoelectric conversion layer over the first electrode layer, forming an organic layer over the photoelectric conversion layer, forming an opening reaching the first electrode layer in the photoelectric conversion layer, and forming a second electrode layer by filling the opening with a conductive paste, in which a contact angle between the conductive paste and the photoelectric conversion layer becomes greater since the organic layer is provided.

The present invention provides a method for manufacturing a solar cell comprising the steps of forming a first electrode layer over a substrate, forming a photoelectric conversion layer over the first electrode layer, modifying a surface of the photoelectric conversion layer by treating the surface of the photoelectric conversion layer with an organic material, forming an opening reaching the first electrode layer in the photoelectric conversion layer; and forming a second electrode layer by filling the opening with a conductive paste, in which a contact angle between the conductive paste and the photoelectric conversion layer becomes greater by treating the photoelectric conversion layer with the organic material.

In the present invention, the substrate is formed from glass, stainless, or a polymeric material.

In the present invention, the polymeric material is a material selected from polyethylene naphthalate (PEN), polyethylene terephthalate (PET), or polybutylene naphthalate (PBN).

In the present invention, the organic layer contains a silane coupling compound.

In the present invention, the conductive paste is any one of a conductive paste which contains silver (Ag), gold (Au), copper (Cu), or nickel (Ni), or a conductive carbon paste.

According to the present invention, miniaturization of an electrode layer and an insulating isolation layer can be realized. Accordingly, the number of cells per unit area can be increased to improve throughput. Further, since a contact angle between a photoelectric conversion layer and an electrode becomes greater, a region which shields light can be reduced to enlarge a light receiving region. The excess thickness of an electrode layer and an insulating isolation layer can be removed, and so reduction in size and weight of a solar cell can be realized.

DETAILED DESCRIPTION OF THE INVENTION

Embodiment Mode of the present invention will be described with reference to the accompanying drawings.

However, it is to be easily understood that various changes and modifications will be apparent to those skilled in the art. Therefore, unless such changes and modifications depart from the invention, they should be construed as being included therein. Note that identical portions or portions having the same function in all figures for explaining embodiment modes are denoted by the same reference numerals and detailed description thereof are omitted.

The embodiment mode of the present invention is described with reference to FIGS. 1A and 1B, 2A and 2B, and 3. First, a transparent conductive film 102 is formed over a substrate 101. In this embodiment mode, a flexible substrate is used as the substrate 101. Specifically, a substrate formed from a polymeric material such as a film formed from polyethylene naphthalate (PEN) is used. In addition to a film formed from polyethylene naphthalate, a film formed from polyethylene terephthalate (PET), polybutylene naphthalate (PBN), or the like may be used. Alternatively, a glass substrate or a stainless substrate may be used.

In this embodiment mode, an indium tin oxide (ITO) film is used as the transparent conductive film 102. In addition to an indium tin oxide (ITO) film, for example, a conductive film of an indium tin oxide containing Si, or a conductive film formed by using a target of an indium oxide containing 2 to 20 wt % of a zinc oxide may be used.

An amorphous semiconductor film 103 is formed over the transparent conductive film 102. The amorphous semiconductor film 103 has a p-type amorphous semiconductor film 103$a$, an amorphous semiconductor film 103$b$ which does not contain an impurity element for imparting a conductive type, and an n-type amorphous semiconductor film 103$c$.

In this embodiment mode, an amorphous semiconductor film containing boron (B) is formed by a plasma CVD method as the p-type amorphous semiconductor film 103$a$. An intrinsic amorphous silicon film is formed by a plasma CVD method as the amorphous semiconductor film 103$b$ which does not contain an impurity element for imparting a conductive type. An amorphous silicon film containing phosphorus (P) may be formed as the n-type amorphous semiconductor film 103$c$, or the n-type amorphous semiconductor film 103$c$ may be formed by forming an intrinsic amorphous silicon film and doping phosphorus thereto.

Figure 1A:
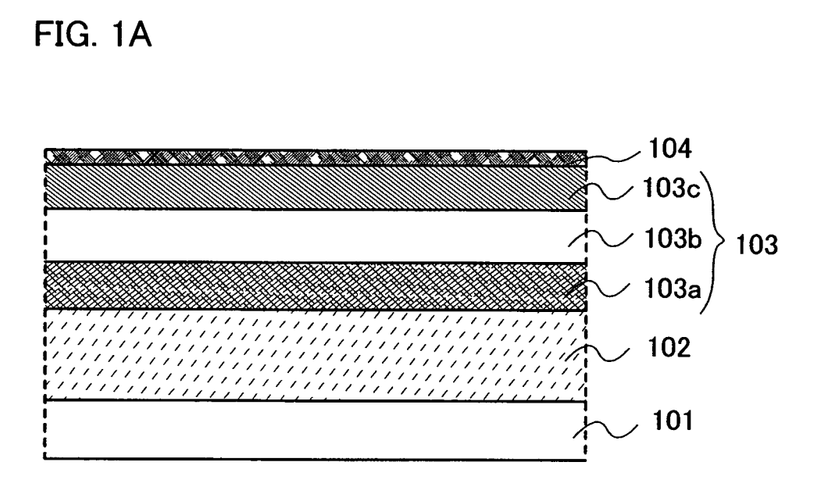
FIGS. 1A and 1B are views showing a manufacturing step of a solar cell according to the present invention.

An organic layer 104 is formed after forming the amorphous semiconductor film 103 (FIG. 1A). A layer formed from an organic material which modifies the surface of the amorphous semiconductor film 103 such as a material having a fluorocarbon chain or a material having a silane coupling agent can be used as the organic layer 104. A silane coupling agent is expressed by a chemical formula Rn-Si—X$_{(4-n)}$ (n=1, 2, and 3). Here, R indicates a material having a relatively inactive group such as an alkyl group. X is formed by a hydrolysis group which can be bonded by condensation with a hydroxyl group or absorption water on a surface of the substrate such as halogen, a methoxy group, an ethoxy group or an acetoxy group. The surface of the amorphous semiconductor film 103 is modified to decrease wettability by forming the organic layer 104, that is, treating the surface of the amorphous semiconductor film 103 with an organic material.

The wettability can be further decreased by using a fluorine-based silane coupling agent having a fluoroalkyl group as R (fluoroalkylsilane (FAS)) which is a typical example of a silane coupling agent. The R of FAS has a structure expressed by $(CF_3)(CF_2)_x(CH_2)_y$, (x is an integer from 0 or more to 10 or less and y is an integer from 0 or more to 4 or less). When a plurality of R or X is bonded to Si, each of R and X may be the same or different. As a typical example of fluoroalkylsilane (also referred to as FAS hereinafter), such as heptadefluorotetrahydrodecyltriethoxysilane, heptadecafluorotetrahydrodecyltrichlorosilane, tridecafluorotetrahydrooctyltrichlorosilane, and trifluoropropyltrimethoxysilane can be given.

As a material for modifying the surface of the amorphous semiconductor film 103, a silane coupling agent having an alkyl group as R instead of a fluorocarbon chain can be used. For example, octadecyltrimethoxysilane as organic silane can be used.

In the case where a layer formed from a material for modifying the surface of the amorphous semiconductor film 103 is formed on the surface of the amorphous semiconductor film 103 by an application method, a solvent in which the foregoing materials are dispersed such as a hydrocarbon solvent like n-pentane, n-hexane, n-heptane, n-octane, n-decane, dicyclopentane, benzene, toluene, xylene, durene, indene, tetrahydronaphthalene, decahydronaphthalene, or squalane; or tetrahydrofuran can be used.

The organic layer 104 modifies the surface of the amorphous semiconductor film 103. When an electrode is formed from a conductive paste in a following step, a contact angle between the conductive paste and the surface of the amorphous semiconductor film 103 can be greater. Such a modification of the surface of the amorphous semiconductor film is considered to be caused by a reaction of a hydroxyl group in the amorphous semiconductor film and the organic layer.

Figure 1B:
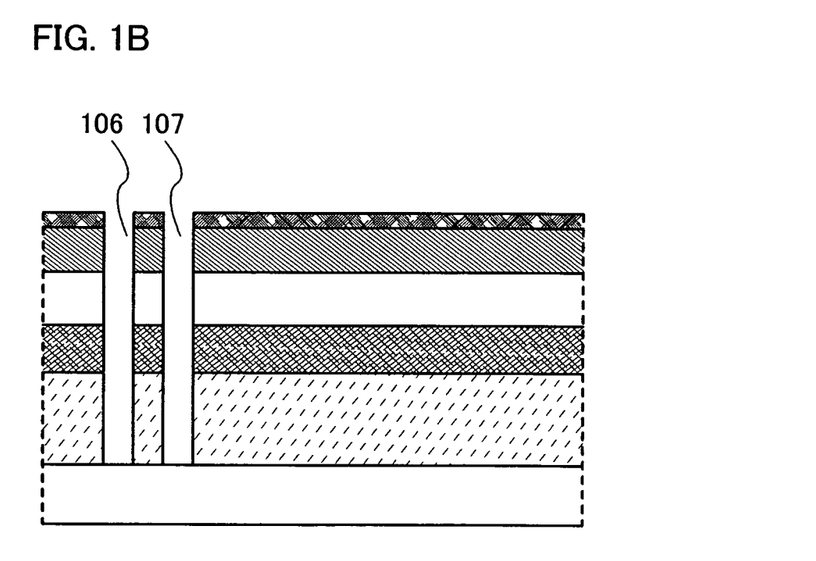

Next, contact holes 106 and 107 are formed by laser scribing through the transparent conductive film 102, the amorphous semiconductor film 103, and the organic layer 104 (FIG. 1B). The contact holes 106 and 107 are formed to have widths of 50 μm to 300 μm. The contact holes 106 and 107 reach the transparent conductive film 102, and bottom surfaces of the contact holes 106 and 107 may be the substrate 101 as shown in FIG. 1B.

Figure 2A:
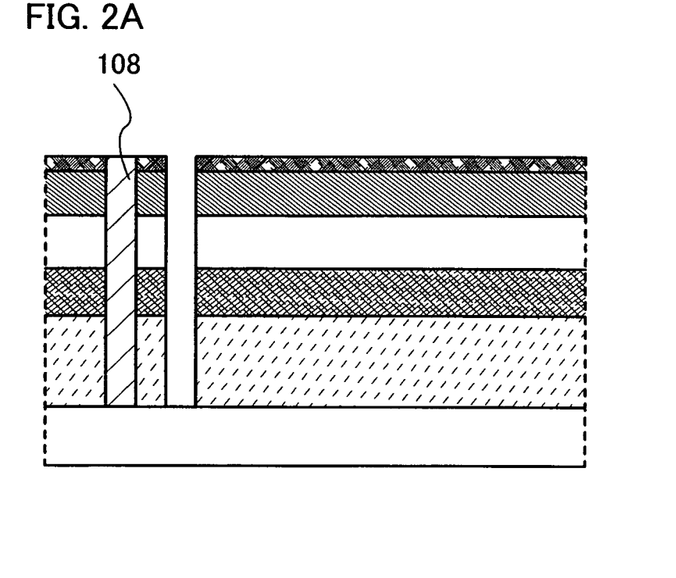
FIGS. 2A and 2B are views showing a manufacturing step of a solar cell according to the present invention.

The contact hole 106 is filled with an insulating material to form an insulating layer 108 for insulating isolation (FIG. 2A). The insulating layer 108 is formed by an ink jet method, a screen printing method, or the like. When forming the insulating layer 108 by an ink jet method, a composition containing a photosensitive material is used. For example, a positive resist obtained by dissolving or dispersing a novolac resin and a naphthoquinone-diazide compound which is a photosensitive agent in a solvent; or a negative resist obtained by dissolving or dispersing a base resin, diphenylsilanediol, an acid generating agent, and the like in a solvent is used. As the solvent, esters such as butyl acetate or ethyl acetate, alcohols such as isopropyl alcohol or ethyl alcohol, and organic solvents such as methyl ethyl ketone or acetone, or the like are used. The concentration of the solvent is set appropriately according to a type or the like of a resist.

Figure 2B:
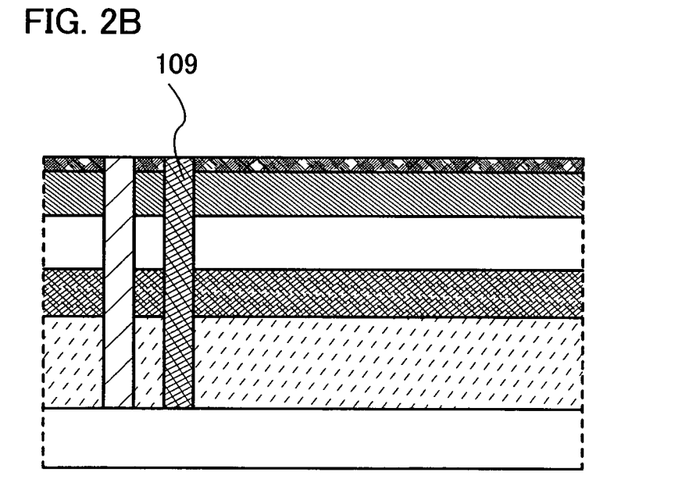

The contact hole 107 is filled with a conductive paste to form an electrode 109 by an ink jet method or a screen printing method (FIG. 2B). As the conductive paste, a conductive paste containing silver (Ag), gold (Au), copper (Cu), nickel (Ni), or the like or a conductive carbon paste can be used. In this embodiment mode, the electrode 109 is formed using a silver (Ag) paste.

Since the organic layer 104 is provided on a surface of the amorphous semiconductor layer 103, a surface tension of the conductive paste to the organic layer 104 is increased. Therefore, the region where light is shielded by the conductive paste can be decreased.

Figure 3:
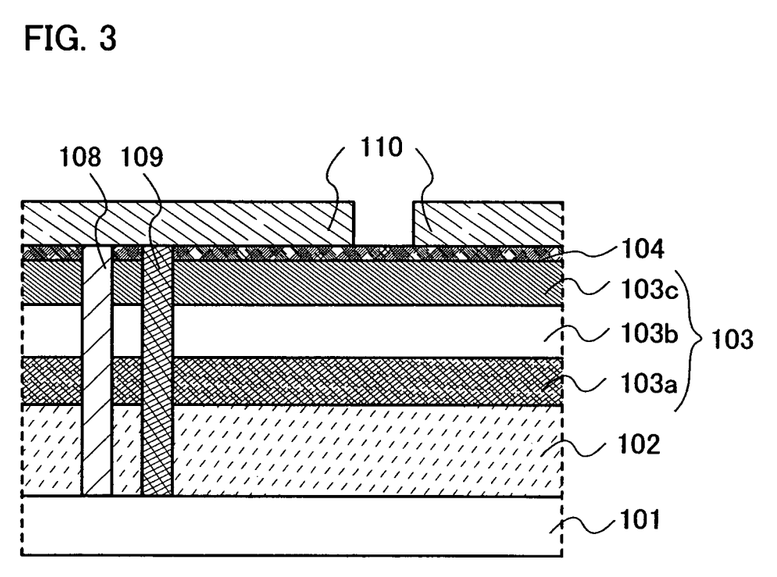
FIG. 3 is a view showing a manufacturing step of a solar cell according to the present invention.

After the electrode 109 is formed, a conductive layer 110 which is electrically connected to the electrode 109 is formed (FIG. 3). As a method for forming the conductive layer 110, a sputtering method, a vapor deposition method, a plating method, a screen printing method, an ink jet method, or the like is used or a combination of those methods is used. When a sputtering method is used, an element selected from tantalum (Ta), tungsten (W), titanium (Ti), molybdenum (Mo), or aluminum (Al), or an alloy material or a compound material containing the foregoing elements as a main component can be used as a material for the conductive layer 110. When an ink jet method is used, a conductive paste containing a metal material such as silver (Ag), gold (Au), copper (Cu), nickel (Ni), or the like can be used.

Either the insulating layer 108 or the electrode 109 may be formed at first.

In FIG. 3, the insulating layer 108 and the electrode 109 can be formed so as not to overflow from the contact holes 106 and 107, respectively, since the organic layer 104 is provided.

Figure 11A:
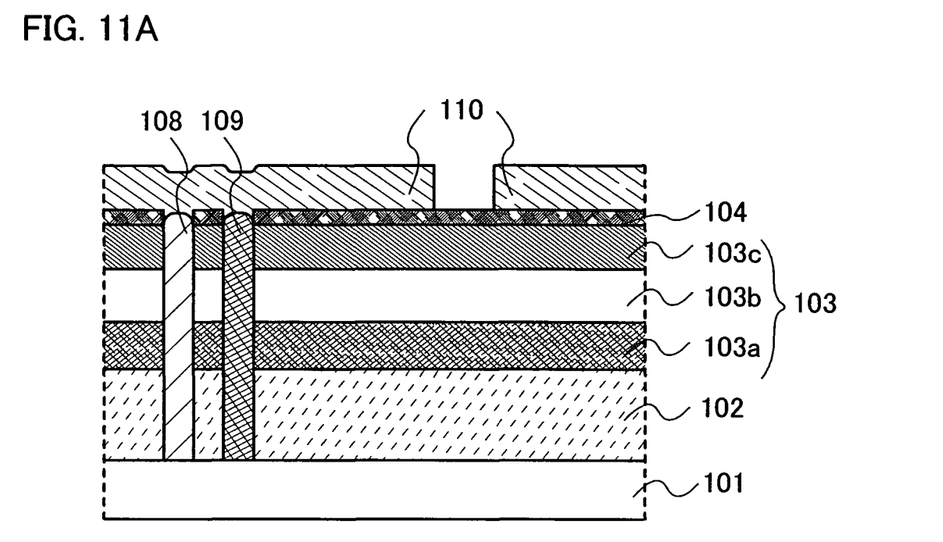
FIGS. 11A and 11B are views showing a manufacturing step of a solar cell according to the present invention.
Figure 11B:
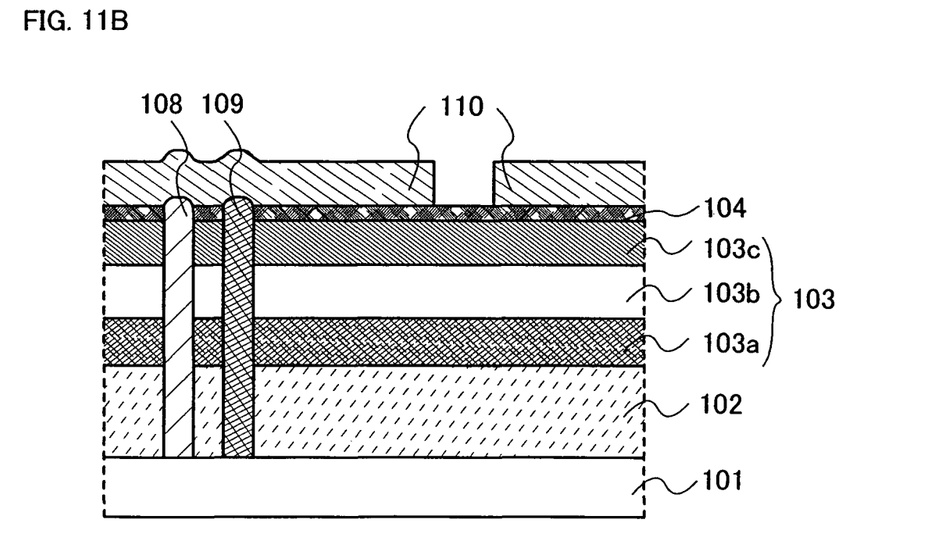

It is preferably that the insulating layer 108 and the electrode 109 are formed so as not to overflow from the contact holes 106 and 107, respectively. As shown in FIG. 11A, the insulating layer 108 and the electrode 109 may be slightly thinner than the contact holes 106 and 107. Alternatively, as shown in FIG. 11B, the insulating layer 108 and the electrode 109 may be slightly thicker than the contact holes 106 and 107.

Accordingly, a solar cell according to the present invention can be manufactured. According to the present invention, a solar cell which has an enlarged light receiving region and a thinner thickness can be manufactured. Further, the number of a solar cell which can be manufactured per unit area of a substrate can be increased.

[Embodiment 1]

This embodiment is described with reference to FIGS. 4A to 4C, 5, and 6. In this embodiment, a method for manufacturing an integrated solar cell in which an organic resin material is used for a substrate and a plurality of unit cells is connected in series on one substrate is described.

Figure 4A:
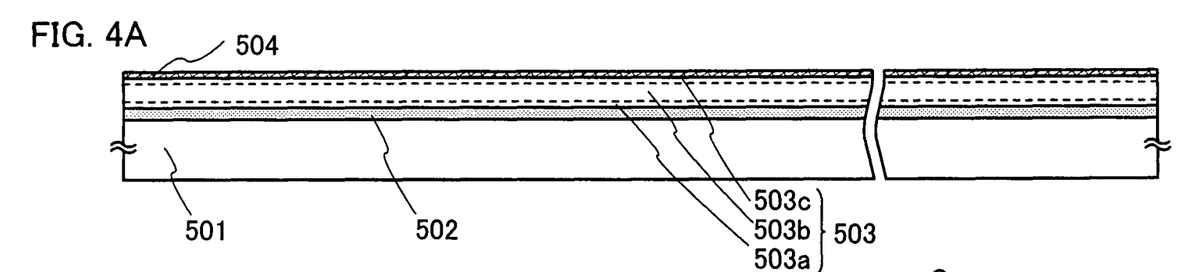
FIGS. 4A to 4C are views showing a manufacturing step of a solar cell according to the present invention.

In FIG. 4A, a translucent organic resin material such as polyethylene terephthalate (PET), polyethylene naphthalate (PEN), or polyethersulfone (PES) is used for a substrate 501. Of course, commercially available soda-lime glass, alkali-free glass, or a stainless substrate can also be used.

A sheet-like substrate of a suitable size may be used as the substrate 501. When manufacturing a solar cell according to this embodiment by a roll-to-roll method, a rolled substrate may be used. In the case where a roll-to-roll method is applied, an organic resin film substrate having a thickness of 60 to 100 μm is preferably used.

The solar cell manufactured in this embodiment has such a structure in which light is received by a surface of a substrate opposite to a surface on which a photoelectric conversion layer is formed. First, a transparent electrode layer 502 is formed on the substrate 501. The transparent electrode layer 502 is formed from an indium tin oxide alloy (ITO), a zinc oxide (ZnO), a tin oxide ($SnO_2$), an ITO-ZnO alloy, or the like to have a thickness of 40 to 200 nm (preferably, 50 to 100 nm). Since a continuously usable maximum temperature of the foregoing organic resin material is 200° C. or less, the transparent electrode layer 502 is formed by a sputtering method, a vacuum evaporation method, or the like, and the film formation is carried out while the substrate temperature is limited within the range from a room temperature to approximate 150° C. Detailed forming conditions may be determined appropriately by an operator to obtain a sheet resistance of 20 to 200 Ω/□ for the above film thickness.

In terms of decreasing the resistance of the transparent electrode layer 502, an ITO film is suitable. However, if an ITO film is exposed to a plasma atmosphere containing hydrogen when forming a semiconductor layer thereon, a light transmitting property of the ITO film is deteriorated because of the reduction. In order to prevent this, it is appropriate that a $SnO_2$ film or a ZnO film is formed on the ITO film. The ZnO (ZnO:Ga) film containing gallium (Ga) of 1 to 10 wt % has a high transmittance and is suitable to be stacked over the ITO film. As an example of a combination, when the ITO film is formed to have a thickness of 50 to 60 nm and the ZnO:Ga film is formed thereon to have a thickness of 25 nm, it is possible to prevent a light transmitting property from being deteriorated, and an excellent light transmitting property can be obtained. In this stacked film, a sheet resistance of 120 to 150 Ω/□ can be obtained.

A non-monocrystalline semiconductor film formed by using a plasma CVD method is used as a photoelectric conversion layer 503 over the transparent electrode layer 502. Typically, the photoelectric conversion layer 503 is formed of a hydrogenated amorphous silicon (a-Si:H) film formed using $SiH_4$ gas as a raw material. Besides, a hydrogenated amorphous silicon germanium (a-SiGe:H) film, a hydrogenated amorphous silicon-carbon (a-SiC:H) film, a hydrogenated microcrystalline silicon (μc-Si:H) film, or the like are used for the photoelectric conversion layer 503. The photoelectric conversion layer 503 is formed of a pin junction, and then p-type and n-type layers with valence electron control may be formed by using a-Si:H or μc-Si:H added with an impurity element such as boron or phosphorus. Especially, μc-Si:H is suitable for the purpose of lowering light absorption loss or making excellent ohmic contact with the transparent electrode layer or a rear electrode layer.

In this embodiment, the photoelectric conversion layer 503 is formed by stacking a p-type semiconductor layer 503a, an i-type semiconductor layer 503b, and an n-type semiconductor layer 503c sequentially over the transparent electrode layer 502. These layers are formed respectively to have thicknesses of 10 to 20 nm, 200 to 1000 nm, and 20 to 60 nm. When a pin junction is formed of such a non-monocrystalline silicon material, an open circuit voltage of approximate 0.4 to 1 V can be obtained. If this pin junction is assumed to be one unit and a plurality of such units are stacked to form a stack type structure, the open circuit voltage can also be raised.

An organic layer 504 is formed over the photoelectric conversion layer 503 to modify the surface of the photoelectric conversion layer 503. The organic layer 504 is formed like the organic layer 104 which is formed in the embodiment mode.

Figure 4B:
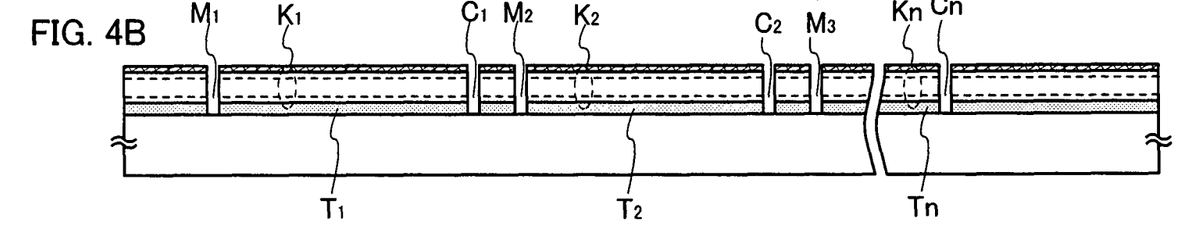

As shown in FIG. 4B, in order to form a plurality of unit cells on one substrate, openings $M_1$ to $M_n$ and $C_1$ to $C_n$ are formed by a laser processing method (laser scribing) through the organic layer 504, the photoelectric conversion layer 503, and the transparent electrode layer 502. The openings $C_1$ to $C_n$ are openings for insulating isolation and are provided to form the unit cells. The openings $M_1$ to $M_n$ are openings for forming connection between the transparent electrode layer and the rear electrode layer. However the kind of a laser used for the laser processing method is not limited, an Nd-YAG laser, an excimer laser, or the like may be used. In any case, by performing a laser process to the lamination of the transparent electrode layer 502 and the photoelectric conversion layer 503, it is possible to prevent the transparent electrode layer from peeling off the substrate when the laser processing is carried out.

Figure 4C:
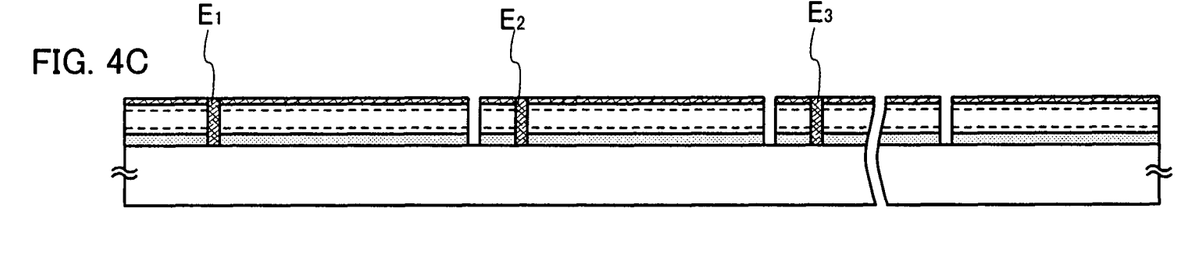

In this way, the transparent electrode layer 502 is divided into $T_1$ to $T_n$, and the photoelectric conversion layer 503 is divided into $K_1$ to $K_n$. Then, as shown in FIG. 4C, the openings $M_1$ to $M_n$ are filled with a conductive paste by an ink jet method, a screen printing method, or the like to form connecting electrode layers $E_1$ to $E_n$.

As the conductive paste, a conductive paste containing silver (Ag), gold (Au), copper (Cu), nickel (Ni), or the like or a conductive carbon paste can be used. In this embodiment, the connecting electrode layers $E_1$ to $E_n$ are formed using a silver (Ag) paste.

Since the organic layer 504 is provided on the surface of the photoelectric conversion layer 503, a surface tension of the conductive paste is increased. Therefore, the conductive paste is prevented from overflowing from the openings $M_1$ to $M_n$ when forming the connecting electrode layers $E_1$ to $E_n$ and the region which shields light can be decreased to enlarge a light receiving region.

The openings $C_1$ to $C_n$ are filled with insulating resin layers $Z_1$ to $Z_n$ to insulate and isolate an element. The insulating resin layers $Z_1$ to $Z_n$ are formed by an ink jet method, a screen printing method, or the like.

In the case where the insulating resin layers $Z_1$ to $Z_n$ are formed by an ink jet method, the insulating resin layers $Z_1$ to $Z_n$ can be formed to have thinner widths because of the organic layer 504 on the surface of the photoelectric conversion layer 503, as in the case of the connecting electrode layers $E_1$ to $E_n$.

In the case of forming the insulating resin layers $Z_1$ to $Z_n$ by an ink jet method, a composition containing a photosensitive material may be used as a material of the insulating resin layer. For example, a positive resist obtained by dissolving or dispersing a novolac resin and a naphthoquinone-diazide compound which is a photosensitive agent in a solvent; or a negative resist obtained by dissolving or dispersing a base resin, diphenylsilanediol, an acid generating agent, and the like in a solvent is used. As the solvent, an organic solvent like esters such as butyl acetate or ethyl acetate, alcohols such as isopropyl alcohol or ethyl alcohol, organic solvents such as methyl ethyl ketone, or acetone is used. The concentration of the solvent is set appropriately according to a type or the like of a resist.

In the case of forming the insulating resin layers $Z_1$ to $Z_n$ by a screen printing method, the insulating resin layers $Z_1$ to $Z_n$ are formed according to the following steps. A phenoxy resin, cyclohexane, isophorone, high resistance carbon black, aerosil, a dispersing agent, an antifoaming agent, and a leveling agent are prepared as insulating resin materials for forming the insulating resin layers $Z_1$ to $Z_n$.

First, among the foregoing raw materials, the phenoxy resin is completely dissolved in a mixture solvent of cyclohexanone and isophorone, and is dispersed for 48 hours by a ball mill made of zirconia with carbon black, aerosol, and the dispersing agent. Next, the antifoaming agent and the leveling agent are added and are further mixed for two hours. Then, a thermal crosslinking reactive resin such as an n-butylated melamine resin and a hardening accelerator is added thereto.

These are further mixed and dispersed to obtain an insulating resin composition for a passivation film.

An insulating film is formed by a screen printing method using the obtained insulating resin composition ink. After applying the insulating resin composition ink, thermal hardening is conducted in an oven for 20 minutes at 160° C. to obtain the insulating resin layers $Z_1$ to $Z_n$.

Although the connecting electrode layers $E_1$ to $E_n$ are formed first in this embodiment, either the connecting electrode layers $E_1$ to $E_n$ or the insulating resin layers $Z_1$ to $Z_n$ may be formed at first.

Figure 5:
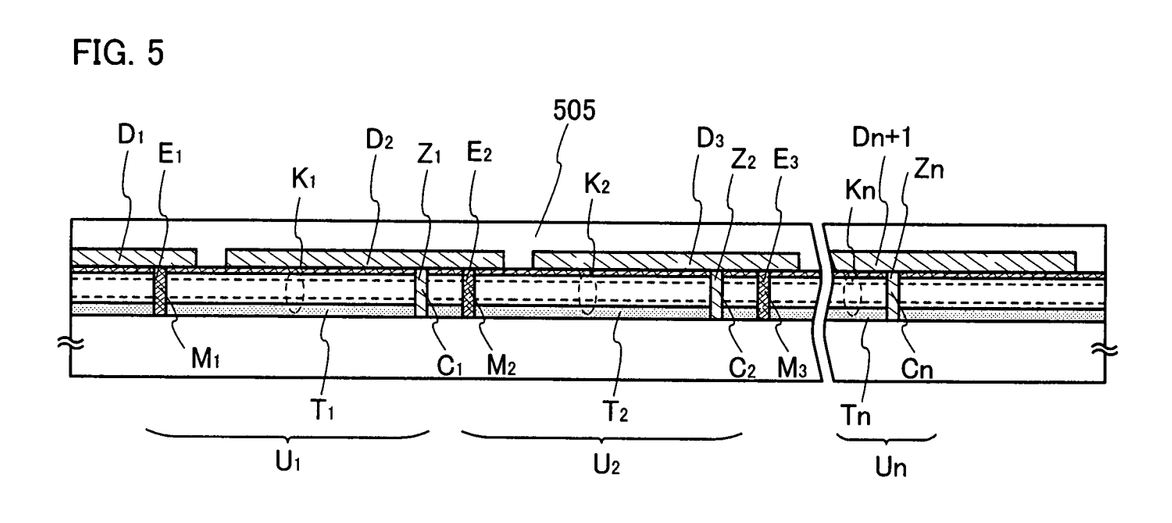
FIG. 5 is a view showing a manufacturing step of a solar cell according to the present invention.

Next, the rear electrode layers $D_1$ to $D_{n+1}$ are formed as shown in FIG. 5. The rear electrode layers $D_1$ to $D_{n+1}$ may be formed by a sputtering method, a vapor deposition method, a plating method, a screen printing method, an ink jet method, or the like.

In the case where a sputtering method is used, an element selected from tantalum (Ta), tungsten (W), titanium (Ti), molybdenum (Mo), or aluminum (Al), or an alloy material or a compound material containing the foregoing elements as a main component can be used as a material for the rear electrode layers $D_1$ to $D_{n+1}$. In the case where an ink jet method is used, a conductive paste containing a metal material such as silver (Ag), gold (Au), copper (Cu), or nickel (Ni) can be used as a material for the rear electrode layers $D_1$ to $D_{n+1}$.

A method for forming the rear electrode layers $D_1$ to $D_{n+1}$ by a screen printing method is described hereinafter. A graphite powder, a high conductive black, an oleic acid (dispersing agent), and isophorone (solvent) are prepared as a conductive ink to be used.

These materials are put into a ball mill to be crushed for 24 hours to obtain finer particles. Then, 20 wt % of γ-butyrolactone lacquer of a saturated polyester resin is added thereto.

Then, the antifoaming agent and the leveling agent are added thereto.

Further, a paste obtained after dispersing and mixing by the ball mill is further dispersed by a three-roll mill to obtain a conductive carbon paste.

This paste is added with ethyl acetoacetate block body (solid content 80 wt %, NCO content 10 wt %) Coronate 2513 which is obtained by blocking isocyanate of hexamethylene-diisocyanate-based polyisocyanate of aliphatic polyfunctional isocyanate by ethyl acetoacetate and by diluting it with a solvent of cellosolve acetate and xylene at a rate of 1 to 1, and mixed sufficiently by a disper, to be defoamed sufficiently. Thus, a conductive carbon paste is obtained.

Then, the obtained conductive carbon paste is printed into a predetermined pattern by a screen printing method, and after being leveled and dried, the paste is firmly hardened at 150° C. for 30 minutes to form the rear electrode layers $D_1$ to $D_{n+1}$ as shown in FIG. 5.

The respective rear electrode layers $D_1$ to $D_{n+1}$ are formed so as to be connected with the transparent electrode layers $T_1$ to $T_n$ at the openings $M_1$ to $M_n$. The openings $M_1$ to $M_n$ are filled with the connecting electrode layers $E_1$ to $E_n$. The rear electrode layers $D_1$ to $D_{n+1}$ are electrically connected to the transparent electrode layers $T_1$ to $T_n$, respectively, through the connecting electrode layers $E_1$ to $E_n$.

Finally, in order to form a sealing resin layer 505 by a printing method, an epoxy resin, γ-butyrolactone, isophorone, an antifoaming agent, and a leveling agent are prepared as a raw material of a sealing resin.

First, among the foregoing raw materials, the epoxy resin is completely dissolved in a mixture solvent of γ-butyrolactone/isophorone, and is dispersed by a ball mill made of zirconia. Next, the antifoaming agent and the leveling agent are further added thereto. The solvent is further mixed, and a butylated melamine resin is added as a thermal crosslinking reactive component.

These are further mixed and dispersed to obtain an ink composition having a transparent and insulating property for a surface protecting and sealing film.

The sealing resin layer 505 is formed by a screen printing method using the obtained ink composition and is thermally hardened at 150° C. for 30 minutes. In the sealing resin layer 505, opening portions are formed so as to reach the rear electrode layers $D_1$ and $D_{n+1}$. The sealing resin layer 505 is connected to an external circuit substrate through the opening portions.

As described above, a unit cell having the transparent electrode layers $T_1$ to $T_n$, the photoelectric conversion layers $K_1$ to $K_n$, the connecting electrode layers $E_1$ to $E_n$, and the rear electrode layers $D_1$ to $D_{n+1}$ are formed over the substrate 501.

And a solar cell of the n series-connected unit cells can be formed by connecting the adjacent rear electrode layers $D_1$ to $D_{n+1}$ to the transparent electrode layers $T_1$ to $T_n$ through the openings $M_1$ to $M_n$. The rear electrode layer $D_1$ becomes a lead-out electrode of the transparent electrode layer $T_1$ in the unit cell $U_1$ whereas the rear electrode layer $D_{n+1}$ becomes a lead-out electrode of the transparent electrode layer $T_n$ in the unit cell $U_1$.

Figure 6:
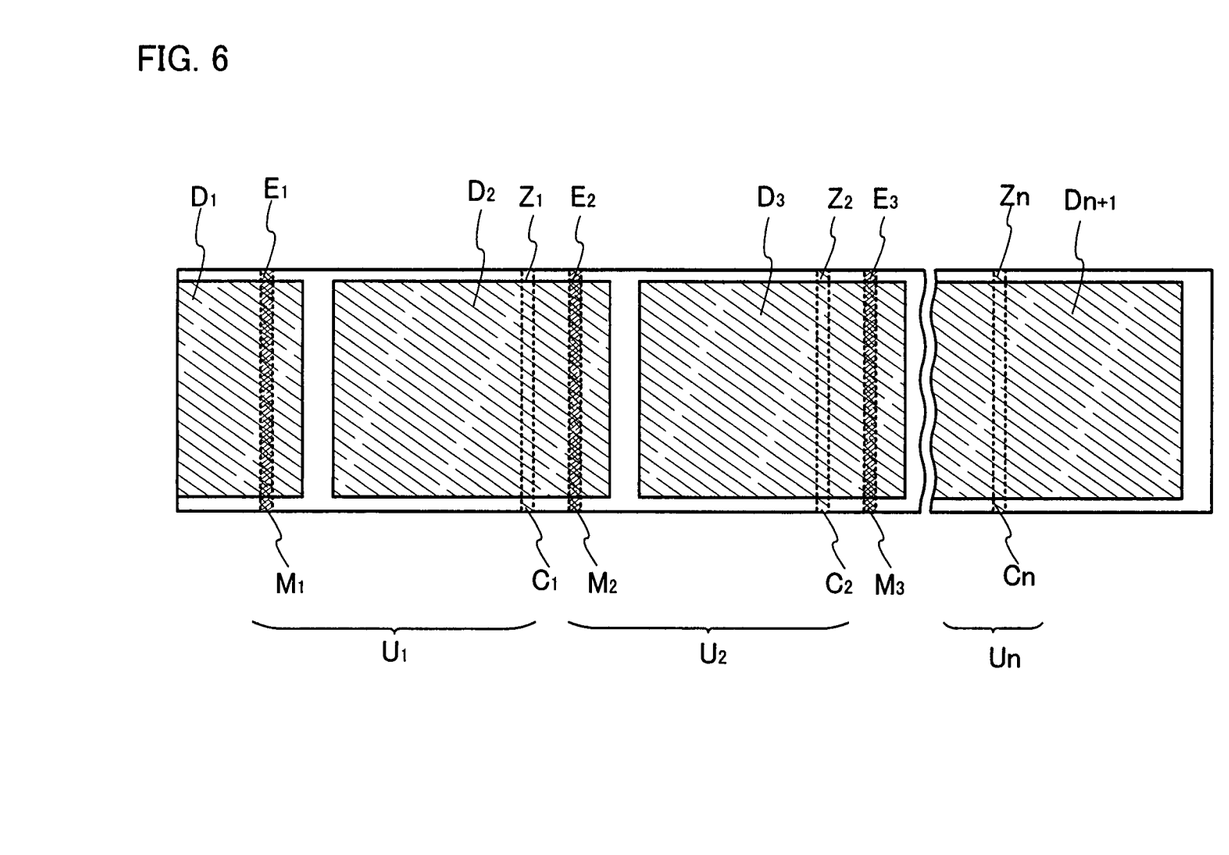
FIG. 6 is a top view of a solar cell according to the present invention.

FIG. 6 is a top view showing a positional relationship between the openings $C_1$ to $C_n$, and $M_1$ to $M_n$, the connecting electrode layers $E_1$ to $E_n$, the insulating resin layers $Z_1$ to $Z_n$, and the rear electrode layers $D_1$ to $D_{n+1}$ in FIG. 5. As shown in FIG. 6, the unit cells $U_1$ to $U_n$ are series-connected to form a solar cell.

[Embodiment 2]

In this embodiment, examples of various electrical devices having a solar cell manufactured according to the present invention are described with reference to FIGS. 7, 8A to 8C, and 9.

Figure 7:
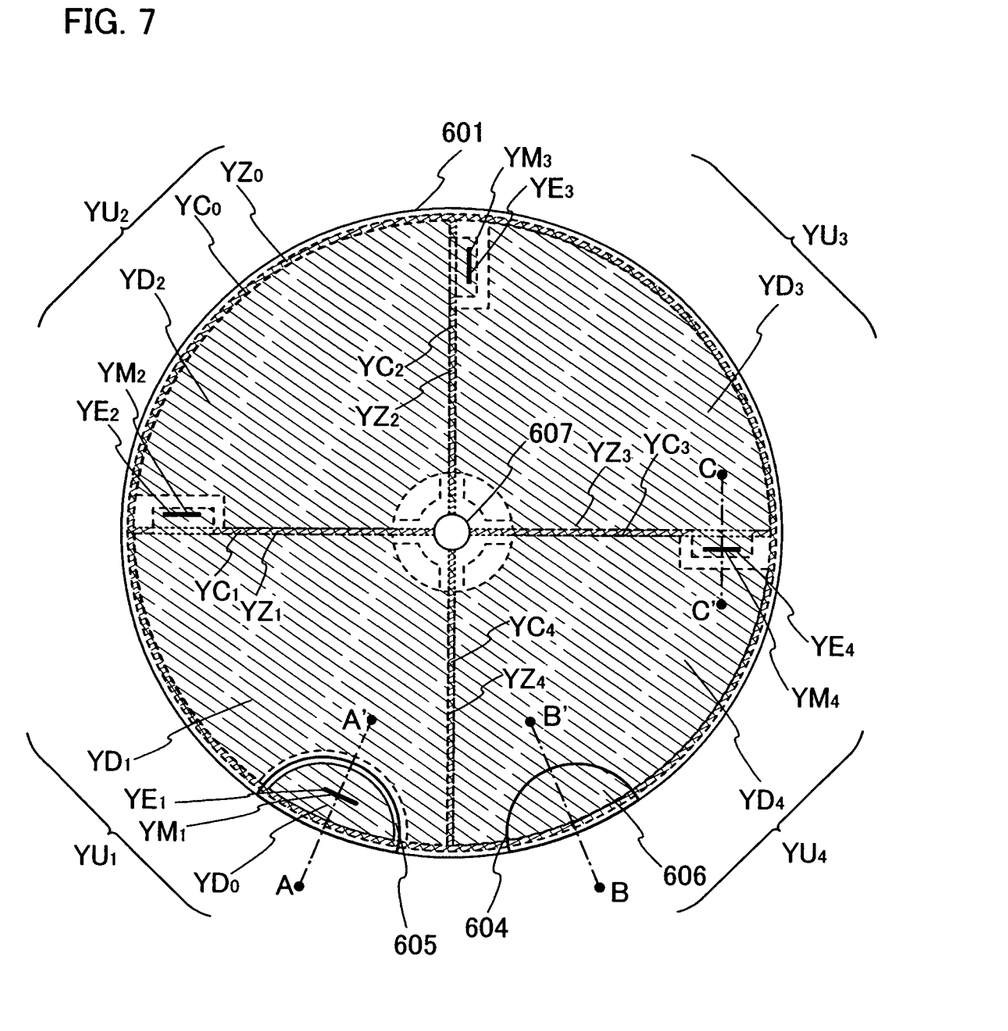
FIG. 7 is an example of an electric device manufactured according to the present invention.

FIG. 7 is a top view of a solar cell according to this embodiment seen from a rear electrode side. FIG. 7 shows an example of a wrist watch in which a solar cell placed at the lower side (portion in which a movement of a wrist watch is installed) of a semitranslucent dial. A substrate 601 is an organic resin film having a thickness of 70 μm. Although any of the organic resin materials referred in Embodiment 1 can be applied, a PEN substrate is typically used for the substrate 601. The shape of the substrate 601 is not limited to a circle. An insertion port 607 of a pointer shaft is provided at the center.

In the solar cell, a transparent electrode layer, a photoelectric conversion layer, a rear electrode layer, and a sealing resin layer are stacked over the substrate 601 sequentially. These are formed in the same manner as Embodiment 1. Although four unit cells are concentrically arranged on the substrate 601, the structure of series connection of the solar cell is basically the same as the embodiment 1.

In FIG. 7, unit cells $YU_1$ to $YU_4$ are defined by an opening $YC_0$ formed in transparent electrode layers $YT_1$ to $YT_4$ and photoelectric conversion layers $YK_1$ to $YK_4$, and by openings $YC_1$ to $YC_4$ in the inside of the opening $YC_0$. The openings $YC_0$ to $YC_4$ are filled with insulating resin layers $YZ_0$ to $YZ_4$.

Connecting electrode layers $YE_1$ to $YE_4$ are formed by an ink jet method using a metal paste such as a silver (Ag) paste in the photoelectric conversion layers and the transparent electrode layers. Rear electrode layers $YD_1$ to $YD_4$ are connected respectively to the transparent electrode layers $YT_2$ to $YT_4$ of the adjacent unit cells by the connecting electrode layers $YE_1$ to $YE_4$ formed in the openings $YM_2$ to $YM_4$. A sealing resin layer 604 is formed on the entire surface of the rear electrode layers except for connection portions 605 and 606 which are connected to a circuit substrate of the wrist watch. An output electrode $YD_0$ of the transparent electrode is formed at the connection portion 605 which is connected to the circuit substrate and, the output electrode $YD_0$ is connected to the transparent electrode layer through an opening $YM_1$. As shown in the drawing, the output electrode $YD_0$ is formed to be isolated from the rear electrode layer $YD_1$. The rear electrode layer $YD_4$, which is the other connection portion 606 serves also as an output electrode.

Figure 8A:
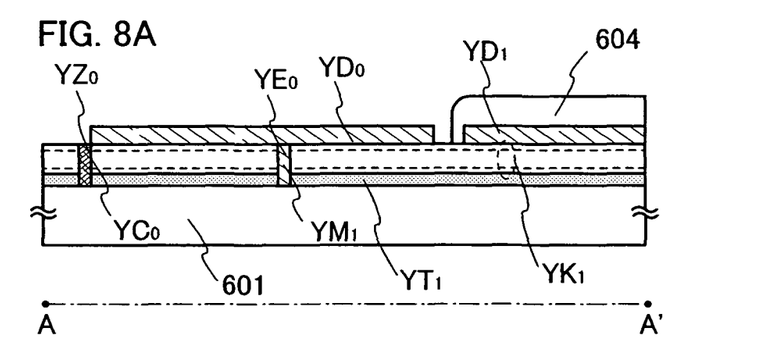
FIGS. 8A to 8C are cross-sectional views of an example of an electric device manufactured according to the present invention.

FIG. 8A shows a sectional view taken along a line A-A' of the periphery of the connection portion 605 which is connected to the circuit substrate in FIG. 7. The transparent electrode layer, the photoelectric conversion layer, and the rear electrode layer are formed over the substrate 601. The openings $YC_0$ and $YM_1$ are formed by a laser processing method through the transparent electrode layer and the photoelectric conversion layer, and the insulating layer $YZ_0$ is formed in the opening $YC_0$ to fill the opening. The output electrode $YD_0$ at the side of the transparent electrode layer side is connected to the transparent electrode layer $YT_1$ of the unit cell $YU_1$ through a connecting electrode layer $YE_0$ formed in the opening $YM_1$. The sealing resin layer 604 is formed over the rear electrode layer $YD_1$ of the unit cell $YU_1$.

Figure 8B:
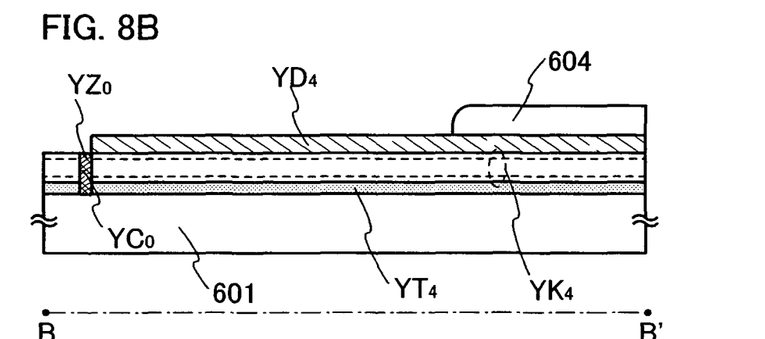

Similarly, FIG. 8B shows a sectional view taken along a line B-B' of the periphery of the connection portion 606 to an external circuit. The transparent electrode layer $YT_4$, the photoelectric conversion layer $YK_4$, and the rear electrode layer $YD_4$ are formed over the substrate 601. The transparent electrode layer $YT_4$ is formed at the inside of the edge by the opening $YC_0$. The insulating layer $YZ_0$ fills the opening. Although the sealing resin layer is formed over the rear electrode layer $YD_4$, it is not formed over the connection portion 606.

Figure 8C:
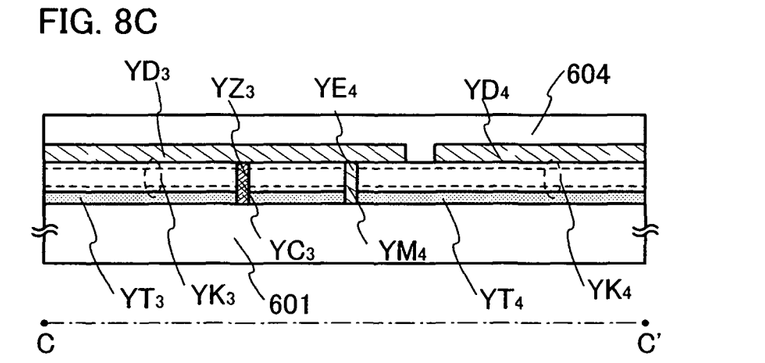

FIG. 8C shows a sectional view taken along a line C-C' of the periphery of the connection portion of the adjacent unit cells in FIG. 7. The transparent electrode layers $YT_3$ and $YT_4$ are formed over the substrate 601, and are insulated and isolated from each other by the insulating layer $YZ_3$ formed in the opening $YC_3$. Similarly, the photoelectric conversion layers $YK_3$ and $YK_4$ are also isolated. The rear electrode layer $YD_3$ is connected to the transparent electrode layer $YT_4$ through the connecting electrode layer $YE_4$ formed in the opening $YM_4$, thereby the unit cells $YU_3$ and $YU_4$ are connected.

Figure 9:
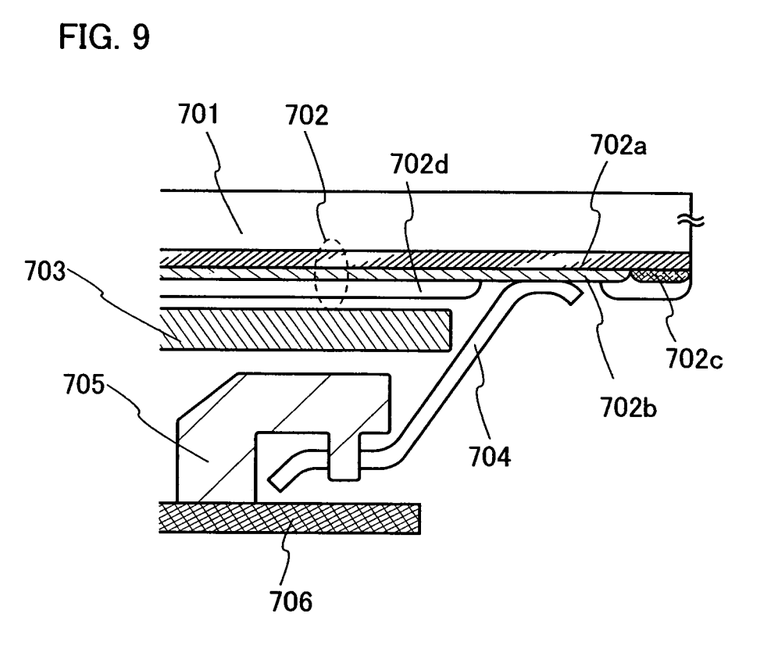
FIG. 9 is an example of an electric device manufactured according to the present invention.

As described above, it is possible to form the solar cell in which the four unit cells $YU_1$ to $YU_4$ are connected in series. In solar cells installed in various electronic devices such as a calculator or a watch, there is an adopted method of direct connection using a coil spring or a plate spring, in addition to a connecting method using soldering or a thermosetting adhesive to connect a solar cell to a circuit in the electronic device. FIG. 9 is a view for explaining an example of such a connection where connection between a photoelectric conversion device 702 and a circuit substrate 706 is made through a connection spring. The structure of the photoelectric conversion device 702 is simply shown in which a rear electrode 702b, an insulating resin 702c, and a sealing resin 702d are formed over a substrate 702a. In addition, a stainless structural body 703, a support body 701 and the like are also included. A connection spring 704 is in contact with the rear electrode at an opening portion of the sealing resin 702d, and electrical connection is formed to a circuit substrate 706 through a terminal portion 705. A connection structure of a contact by applying pressure using mechanical force like this does not give severe damage to a solar cell compared with a connection method such as soldering or heat sealing, and does not cause a yield to be lowered in a manufacturing process.

Figure 10A:
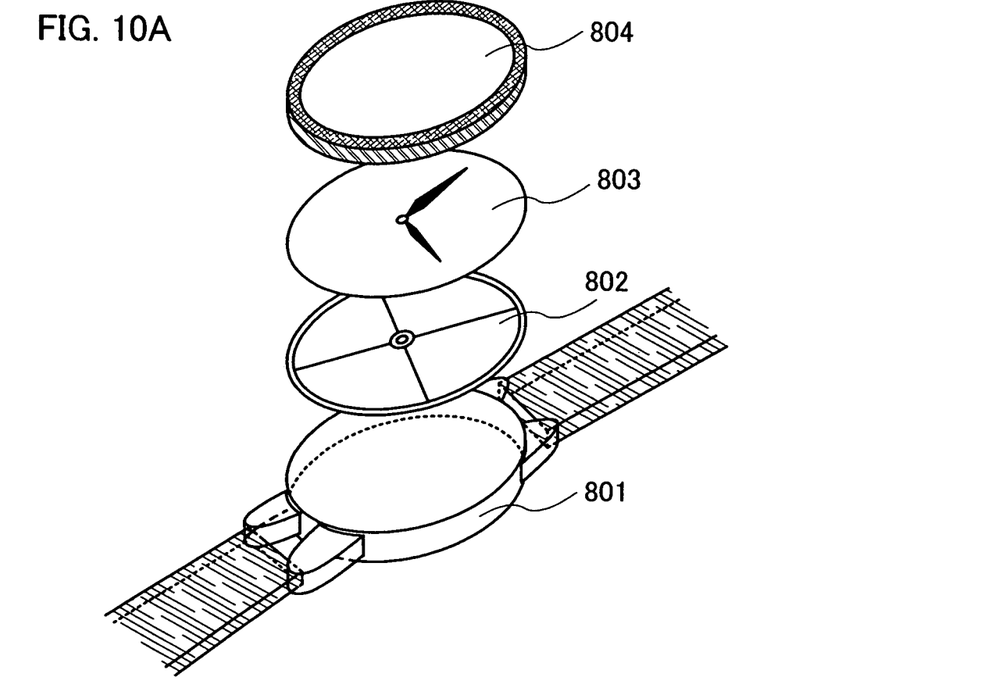
FIGS. 10A and 10B are examples of an electric device manufactured according to the present invention.

FIG. 10A shows a wrist watch which has a solar cell manufactured by the foregoing method. The wrist watch includes a housing 801, the solar cell 802 shown in FIG. 7, a dial 803 having a long hand and a short hand, and a cover 804.

Figure 10B:
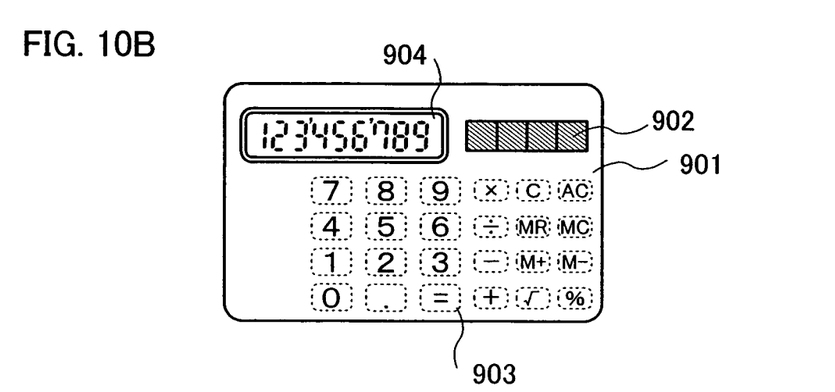

FIG. 10B shows a calculator which has a solar cell manufactured according to the present invention. The calculator includes a housing 901, a solar cell 902, buttons 903, and a display panel 904. The solar cell shown in FIGS. 5 and 6 in Embodiment 1 may be used as the solar cell 902.

According to the present invention, by forming an electrode layer and an insulating isolation layer of a solar cell minutely, excess portion can be omitted, a region shielding light can be reduced, and thereby a light receiving region can be enlarged. Thus, reduction in size and weight of a solar cell and an electronic device having the solar cell can be realized.

What is claimed is:

1. A method for manufacturing a solar cell comprising the steps of:
    forming a first electrode layer over a substrate;
    forming a photoelectric conversion layer over the first electrode layer;
    forming an organic layer for decreasing wettability of an entire top surface of the photoelectric conversion layer over and in direct contact with the entire top surface of the photoelectric conversion layer;
    forming a first opening and a second opening reaching the first electrode layer in the photoelectric conversion layer after the organic layer is formed;
    forming a second electrode layer by filling the first opening with a conductive paste;
    forming an insulating layer by filling the second opening with an insulating material after forming the second electrode layer; and
    forming a conductive layer by a sputtering method over and in contact with the organic layer and the second electrode layer after the second electrode layer is formed,
    wherein bottom surfaces of the first opening and the second opening reach up to a top surface of the substrate,
    wherein the second electrode layer is formed by an ink jet method, and
    wherein a contact angle between the conductive paste and the photoelectric conversion layer becomes greater by providing the organic layer.

2. The method for manufacturing a solar cell according to claim 1, wherein the substrate is formed from glass, stainless, or a polymeric material.

3. The method for manufacturing a solar cell according to claim 2, wherein the polymeric material is a material selected from polyethylene naphthalate (PEN), polyethylene terephthalate (PET), and polybutylene naphthalate (PBN).

4. The method for manufacturing a solar cell according to claim 1, wherein the organic layer contains a silane coupling compound.

5. The method for manufacturing a solar cell according to claim 1, wherein the conductive paste contains at least one of silver (Ag), gold (Au), copper (Cu), nickel (Ni), and carbon.

6. A method for manufacturing a solar cell comprising the steps of:
    forming a first electrode layer over a substrate;
    forming a photoelectric conversion layer over the first electrode layer;
    forming an organic layer over and in direct contact with an entire top surface of the photoelectric conversion layer to decrease wettability of the entire top surface of the photoelectric conversion layer;
    forming a first opening and a second opening reaching the first electrode layer in the photoelectric conversion layer after the organic layer is formed;
    forming a second electrode layer by filling the first opening with a conductive paste by an ink jet method;
    forming an insulating layer by filling the second opening with an insulating material after forming the second electrode layer; and
    forming a conductive layer by a sputtering method over and in contact with the organic layer and the second electrode layer after the second electrode layer is formed,
    wherein bottom surfaces of the first opening and the second opening reach up to a top surface of the substrate.

7. The method for manufacturing a solar cell according to claim 6, wherein the substrate is formed from glass, stainless, or a polymeric material.

8. The method for manufacturing a solar cell according to claim 7, wherein the polymeric material is a material selected from polyethylene naphthalate (PEN), polyethylene terephthalate (PET), and polybutylene naphthalate (PBN).

9. The method for manufacturing a solar cell according to claim 6, wherein the organic layer contains a silane coupling compound.

10. The method for manufacturing a solar cell according to claim 6, wherein the conductive paste contains at least one of silver (Ag), gold (Au), copper (Cu), nickel (Ni), and carbon.

11. A method for manufacturing a semiconductor device comprising the steps of:
    forming a first electrode layer over a substrate;
    forming a photoelectric conversion layer over the first electrode layer;
    forming an organic layer for decreasing wettability of an entire top surface of the photoelectric conversion layer over and in direct contact with the entire top surface of the photoelectric conversion layer;
    forming a first opening and a second opening reaching the first electrode layer in the photoelectric conversion layer after the organic layer is formed;
    forming a second electrode layer by filling the first opening with a conductive paste;
    forming an insulating layer by filling the second opening with an insulating material after forming the second electrode layer; and
    forming a conductive layer by a sputtering method over and in contact with the organic layer and the second electrode layer after the second electrode layer is formed,
    wherein bottom surfaces of the first opening and the second opening reach up to a top surface of the substrate,
    wherein the second electrode layer is formed by an ink jet method, and
    wherein a contact angle between the conductive paste and the photoelectric conversion layer becomes greater by providing the organic layer.

12. The method for manufacturing a semiconductor device according to claim 11, wherein the substrate is formed from glass, stainless, or a polymeric material.

13. The method for manufacturing a semiconductor device according to claim 12, wherein the polymeric material is a material selected from polyethylene naphthalate (PEN), polyethylene terephthalate (PET), and polybutylene naphthalate (PBN).

14. The method for manufacturing a semiconductor device according to claim 11, wherein the organic layer contains a silane coupling compound.

15. The method for manufacturing a semiconductor device according to claim 11, wherein the conductive paste contains at least one of silver (Ag), gold (Au), copper (Cu), nickel (Ni), and carbon.

16. A method for manufacturing a semiconductor device comprising the steps of:
    forming a first electrode layer over a substrate;
    forming a photoelectric conversion layer over the first electrode layer;
    forming an organic layer over and in direct contact with an entire top surface of the photoelectric conversion layer to decrease wettability of the entire top surface of the photoelectric conversion layer;
    forming a first opening and a second opening reaching the first electrode layer in the photoelectric conversion layer after the organic layer is formed;
    forming a second electrode layer including a conductive paste in the first opening by an ink jet method;

forming an insulating layer by filling the second opening with an insulating material after forming the second electrode layer; and forming a conductive layer by a sputtering method over and in contact with the organic layer and the second electrode layer after the second electrode layer is formed, wherein bottom surfaces of the first opening and the second opening reach up to a top surface of the substrate.

17. The method for manufacturing a semiconductor device according to claim 16, wherein the substrate is formed from glass, stainless, or a polymeric material.

18. The method for manufacturing a semiconductor device according to claim 17, wherein the polymeric material is a material selected from polyethylene naphthalate (PEN), polyethylene terephthalate (PET), and polybutylene naphthalate (PBN).

19. The method for manufacturing a semiconductor device according to claim 16, wherein the organic layer contains a silane coupling compound.

20. The method for manufacturing a semiconductor device according to claim 16, wherein the conductive paste contains at least one of silver (Ag), gold (Au), copper (Cu), nickel (Ni), and carbon.

21. The method for manufacturing a solar cell according to claim 1, wherein a top surface of the second electrode layer and a top surface of the insulating layer are lower than a top surface of the organic layer.

22. The method for manufacturing a solar cell according to claim 1, wherein a top portion of the first opening is filled with the conductive layer and a top portion of the second opening is filled with the conductive layer.

23. The method for manufacturing a solar cell according to claim 6, wherein a top surface of the second electrode layer and a top surface of the insulating layer are lower than a top surface of the organic layer.

24. The method for manufacturing a solar cell according to claim 6, wherein a top portion of the first opening is filled with the conductive layer and a top portion of the second opening is filled with the conductive layer.

25. The method for manufacturing a semiconductor device according to claim 11, wherein a top surface of the second electrode layer and a top surface of the insulating layer are lower than a top surface of the organic layer.

26. The method for manufacturing a semiconductor device according to claim 11, wherein a top portion of the first opening is filled with the conductive layer and a top portion of the second opening is filled with the conductive layer.

27. The method for manufacturing a semiconductor device according to claim 16, wherein a top surface of the second electrode layer and a top surface of the insulating layer are lower than a top surface of the organic layer.

28. The method for manufacturing a semiconductor device according to claim 16, wherein a top portion of the first opening is filled with the conductive layer and a top portion of the second opening is filled with the conductive layer.

* * * * *